United States Patent [19]

Goodman et al.

[11] Patent Number: 4,998,156
[45] Date of Patent: Mar. 5, 1991

[54] STRUCTURE FOR A COMPLEMENTARY-SYMMETRY COMFET PAIR

[75] Inventors: Alvin M. Goodman, Princeton, N.J.; Gary M. Dolny, Newtown, Pa.

[73] Assignee: General Electric Company, Schenectady, N.Y.

[21] Appl. No.: 173,498

[22] Filed: Mar. 25, 1988

[51] Int. Cl.⁵ .............................................. H01L 27/02
[52] U.S. Cl. ..................................... 357/42; 357/23.4; 357/86; 357/43
[58] Field of Search ...................... 357/23.4, 42, 43, 86

[56] References Cited

U.S. PATENT DOCUMENTS

| 4,364,963 | 12/1982 | Becke et al. | 357/23 |
| 4,712,124 | 12/1987 | Stupp | 357/43 |
| 4,729,007 | 3/1988 | Coe | 357/43 |
| 4,878,096 | 10/1989 | Shirai et al. | 357/42 |

OTHER PUBLICATIONS

M. R. Simpson et al., "Analysis of the Lateral Insulated Gate Transistor", *IEDM Tech. Dig.*, (1985), pp. 740–743.
A. L. Robinson et al., "Lateral Insulated Gate Transistors with Improved Latching Characteristics," IEDM Tech. Dig., (1985), pp. 744–747.
S. Mukherjee et al., "Influence of Device Structure on the Transient and Steady State Characteristics of LIGT," *Philips Laboratories, North American Philips Corp.*, May 1987, pp. 310–317.

*Primary Examiner*—2
*Assistant Examiner*—Edward J. Wojciechowicz
*Attorney, Agent, or Firm*—Paul R. Webb, II; James C. Davis, Jr.

[57] ABSTRACT

The present invention is a complementary-symmetry COMFET pair consisting of an N-channel lateral COMFET and a P-channel lateral COMFET interconnected in parallel on the same chip. The device is formed in a layer of single-crystalline silicon of one conductivity type with one of the pair of COMFETs being formed directly in this layer. A well of opposite conductivity type is disposed in the layer and the other of the pair of COMFETs is disposed in the well. The two COMFETs are isolated from each other by a highly doped region which extends from the surface of the layer to the substrate and is of the same conductivity type as that of the substrate.

4 Claims, 2 Drawing Sheets

TRUTH TABLE

| G | D | COND. |
|---|---|-------|
| 0 | ± | OFF |
| + | + | ON |
| − | + | OFF |
| + | − | OFF |
| − | − | ON |

STRUCTURE FOR A COMPLEMENTARY-SYMMETRY COMFET PAIR

This invention relates to a solid-state structure for the control of bi-directional current flow. The new structure utilizes a complementary-symmetry pair of conductivity modulated field effect transistors (COMFETs) disposed on the same substrate.

BACKGROUND OF THE INVENTION

The vertical COMFET is commonly used for power applications. As is well known in the industry, the COMFET derives its ability to carry relatively large currents by a greatly increased injection of minority carriers from the substrate. The structure, doping levels, and operation of this type of device are described in U.S. Pat. No. 4,364,073, which issued Dec. 14, 1982, to Becke et al.

There are applications for a device that would control current flow in both directions with low forward voltage drop and high current density. By way of example, such potential applications include motor controls for automobile starters, small appliances, and small power tools. A complementary-symmetry COMFET pair could satisfy this requirement. Such COMFET pairs utilizing vertical geometry would require two separate devices, since no simple method for integrating vertical geometry P-channel and N-channel devices on the source chip appears possible. Lateral, N-channel insulated gate transistors (LIGT) are well known and have been disclosed in the literature. See, for example, Simpson et al., "Analysis of the Lateral Insulated Gate Transistor," *IEDM Tech. Dig.*, 1985, pp. 740–743; and Robinson et al., "Lateral Insulated Gate Transistors with Improved Latching Characteristics," *IEDM Tech. Dig.*, 1985, pp. 744–747.

The present invention utilizes this LIGT geometry for structuring a complementry-symmetry COMFET pair on the same substrate.

SUMMARY OF THE INVENTION

The present invention relates to an integrated circuit device for controlling bi-directional current flow. The device includes a body of semiconducting material of first conductivity type on a substrate of second conductivity type having a doping level of about $10^{15}$ atoms $cm^{-3}$. The body includes a major surface having a plurality of COMFET's disposed therein at the surface. One of the COMFET's is an N-channel transistor and another is a P-channel transistor. The N and P channel transistors are lateral geometry transistors and are electrically interconnected to form a complementary-symmetry COMFET pair.

DESCRIPTION OF THE PREFERRED EMBODIMENT

Figure 1:
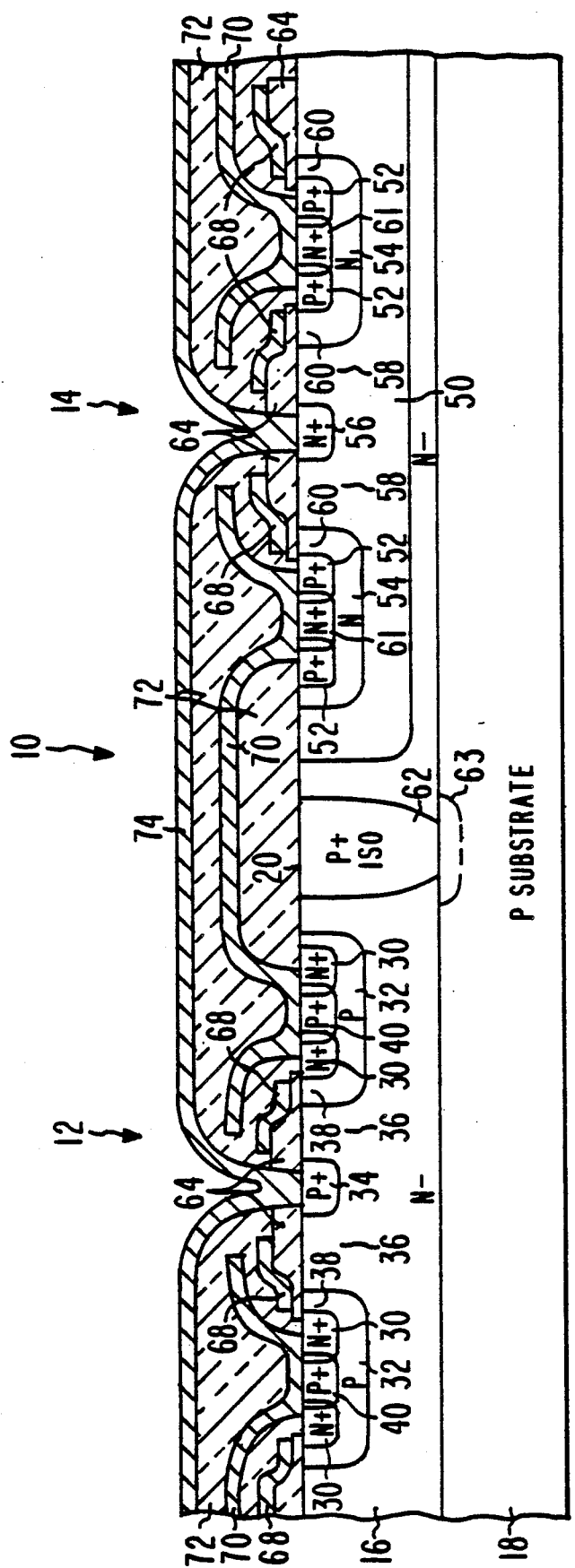
FIG. 1 is a cross-sectional view of a portion of an integrated circuit chip depicting a COMFET pair embodying the teachings of the present invention.

In the following description and as shown in FIG. 1, specific P and N conductivity type materials and regions are indicated. These indications are by way of example and shall not be deemed to limit the teachings of the present invention. It will be understood that devices having opposite P and N arrangements are considered equivalent in all pertinent respects to the devices described herein.

As illustrated in FIG. 1, a COMFET pair 10, incorporating the teachings of the present invention includes an N-channel COMFET 12 and a P-channel COMFET 14. The COMFET pair 10 is formed in a layer 16 of single crystalline silicon which is disposed on a substantially planar substrate 18. The layer 16 is lightly doped first conductivity type, N type in the present example, which may be epitaxially grown as is common in the industry. The layer 16, having a substantially planar surface 20, should have a charge per unit area of about $10^{12}$ atoms $cm^{-2}$. The substrate 18 is of second conductivity type, P type in the present example, and has a doping level of about $10^{15}$ atoms $cm^{-3}$.

The N-channel COMFET 12 includes a source region 30 of N conductivity type, a body region 32 of P conductivity type, and an anode region 34 of P conductivity type. These three regions extend from the surface 20 into the layer 16 thereby defining a drain region 36 which is disposed between the body region 32 and the anode region 34. The source region 30 is located within the body region 32 so that a channel region 38 is defined at the surface 20 and between the source region 30 and the drain region 36. A body contact region 40 of P conductivity type is disposed within the body region 32 overlapping the source region 30 a slight amount. The body region 32 and anode region 34 have doping levels of about $10^{13}$ to $10^{14}$ and $10^{15}$ to $10^{16}$ atoms $cm^{-2}$ respectively, while the source region 30 and drain region 36 have doping levels of about $10^{15}$ to $10^{16}$ atoms $cm^{-3}$ and $10^{12}$ atoms $cm^{-2}$ respectively. The body contact region 40 has a doping level of about $10^{15}$ to $10^{16}$ atoms $cm^{-2}$. The exact doping levels of these five semiconductor regions are selected so that the COMFET 12 operates as a field effect transistor having a minority-carrier-injecting anode region in series with the drain region. For a more detailed discussion of the doping levels and operation of this kind of COMFET, see U.S. Pat. No. 4,364,073, which issued Dec. 14, 1982, to Becke et al. which is hereby incorporated by reference as though set forth verbatim herein.

The P-channel COMFET 14 is similar to the COMFET 12 except that the P and N conductivity types of the source 52, body 54, anode 56, and drain 58 regions are P, N, N, and P respectively, and the COMFET 14 is disposed in a P-well 50 of lightly doped P conductivity type. The source region 52 is located within the body region 54 so that a channel region 60 is defined at the surface 20 between the source region 52 and the drain region 58. A body contact region 61 of N conductivity type is disposed within the body region 54 overlapping the source region 52 a slight amount. The doping levels of the five regions 52, 54, 56, 58, and 61 are similar to the doping levels of the five regions 30, 32, 34, 36, and 40 of the COMFET 12 and are selected so that the COMFET 14 operates as an FET having a minority-carrier injecting anode region in series with the drain region.

The regions 30, 32, 34, 40, 52, 54, 56, 61 and the P-well 50 are formed using any suitable method well known in the industry such as ion implantation. Such implantation method and apparatus for performing the method are well known and, therefore, will not be described herein. The N-channel COMFET 12 is electrically isolated from the P-channel COMFET 14 by an isolation region 62 in the usual manner. The region 62 is of highly doped P conductivity type which extends through the layer 16 from the surface 20 to the substrate 18. The region 62 may be ion implanted from the surface 20 and subsequently thermally driven so that the doping impurities diffuse downwardly toward and ultimately into the surface of the substrate. Alternatively, the isolation region 62 may be formed by implanting a pocket 63 of highly doped P conductivity type into the substrate 18, as shown by the phantomlines in FIG. 1. The region 62 is then ion implanted from the surface 20 and subsequently thermally driven so that the doping impurities diffuse downwardly toward the substrate 18 and upwardly from the pocket 63 until they meet. Other suitable alternative methods of forming the isolation region 62 may include well known diffusion techniques utilizing, for example, boron nitride sources or BSG.

A layer 64 of silicon dioxide is thermally grown on the surface 20 to a thickness of from about 200 nm to about 400 nm. The portions of the layer 64 directly over the channel regions 38 and 60 are masked in a conventional way with a layer of silicon nitride or other suitable material. The remainder of the layer 64 is further thermally grown to a thickness of about 2000 nm and the masking layer removed. Openings are then formed through the layer 64 directly over the source regions 30, 52 and adjacent portions of the body contact regions 40, 61 as shown in FIG. 1. Highly doped polycrystalline silicon gate electrodes 68 are formed in the usual manner on the thin portions of the layer 64 directly over the channel regions 38 and 60. A source electrode 70, which may be aluminum or some other conductor, is formed in ohmic contact with the exposed areas of the source regions 30 and 52 and the adjacent portions of the body regions 32 and 54 as shown in FIG. 1.

A layer 72 of a reflow glass such as BPSG is deposited over COMFETS 12 and 14 and openings formed therethrough to expose portions of the surface 20 directly over the anode regions 34 and 56. A conductor 74 is deposited on the reflow glass in ohmic contact with the exposed portions of the anode regions 34 and 56 thereby serving as a drain electrode for the COMFET pair 10.

Figures 2, 3:
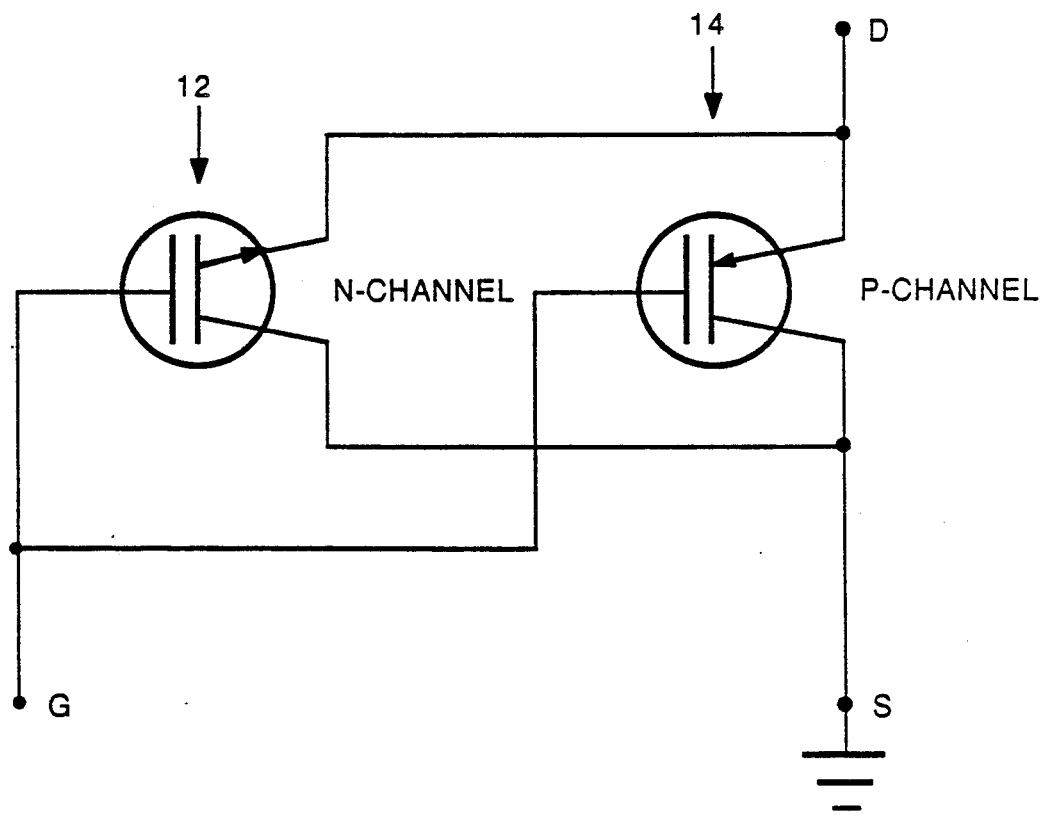
FIG. 2 is a schematic diagram depicting a circuit equivalent to the COMFET pair shown in FIG. 1.
FIG. 3 shows a truth table illustrating all possible operating conditions of the circuit shown in FIG. 2.

A schematic diagram of the equivalent circuit of the COMFET pair 10 is shown in FIG. 2 and a truth table representing the circuit's logical operation is shown in FIG. 3. The COMFETs 12 and 14 function as N-channel AND P-channel transistors respectively and, as shown in FIG. 2, are connected in parallel thereby forming a complementary-symmetry pair. The drain, source, and gate are labeled D, S, and G respectively. As is seen, the COMFET pair 10 is conductive only when the gate and drain are of the same polarity. This is true because for either of the transistors to conduct, the transistor's inversion channel must be conductive and its anode/drift region junction must be forward biased. For example, assume the gate 68 to be positive by a greater amount than the threshold voltage. Then an inversion layer is formed in the channel region 38 but not in the channel region 60, thereby rendering only the N-channel transistor conductive. If, at the same time, the drain electrode 74 is also positive, the PN junction between the anode region 34 and the drain or drift region 36 will be forward biased rendering the COMFET 12 conductive between the source and drain electrodes 70 and 74, respectively. Similarly, when the gate and drain are negative, the COMFET 14 is rendered conductive.

As will be understood by those skilled in the art each of the COMFETs 12 and 14 may comprise a plurality of N and P channel lateral COMFETs interconnected in parallel, or they may be single lateral COMFET cells as shown in FIG. 1.

An important advantage of the present invention is that the complementary symmetry COMFET pair 10 can be made on the same chip using standard, well known materials and processes. This permits the device to be easily integrated with other integrated circuit functions. The device will control current flow in both directions with low forward voltage drop and high current density.

What is claimed is:

1. In an integrated circuit device having a body of semiconducting material of first conductivity type on a substrate of second conductivity type, said body having a major surface and a plurality of COMFETs disposed therein at said major surface, one of said COMFETs being an N-channel transistor and another of said COMFETs being a P-channel transistor, wherein each of said N-channel and P-channel transistors are lateral geometry transistors including a source region and a drain region with an associated minority-carrier-injecting anode region, said drain region of each of said N-channel and P-channel transistors being in series with the associated anode region and having an opposite conductivity type from the associated anode region, said source regions being electrically connected together and said anode regions being electrically connected together to form a complementary-symmetry COMFET pair, and wherein said N-channel transistor is substantially isolated from said P-channel transistor by a highly doped region of second conductivity type extending from said substrate to said major surface.

2. The device set forth in claim 1 wherein said N-channel transistor comprises a plurality of separate N-channel transistors all of which are interconnected in parallel and said P-channel transistor comprises a plurality of separate P-channel transistors all of which are interconnected in parallel.

3. The device as set forth in claim 1 wherein each of said N-channel and P-channel transistors further includes a gate and the gates are electrically connected together.

4. The device set forth in claim 1 wherein each of said N-channel and P-channel transistors further includes a gate and each of said N-channel and P-channel transistors conducts only when its gate and its drain region have the same polarity.

* * * * *